United States Patent
Zhang et al.

(10) Patent No.: US 9,337,867 B2
(45) Date of Patent: May 10, 2016

(54) CYCLIC DECODING FOR CASCADED FORWARD ERROR-CORRECTION FEC CODES

(71) Applicant: NEC Laboratories America, Inc., Princeton, NJ (US)

(72) Inventors: Shaoliang Zhang, Plainsboro, NJ (US); Fatih Yaman, Monmouth Junction, NJ (US); Yequn Zhang, Tucson, AZ (US)

(73) Assignee: NEC Corporation (JP)

( * ) Notice: Subject to any disclaimer, the term of this patent is extended or adjusted under 35 U.S.C. 154(b) by 61 days.

(21) Appl. No.: 14/249,609

(22) Filed: Apr. 10, 2014

(65) Prior Publication Data

US 2014/0310580 A1    Oct. 16, 2014

Related U.S. Application Data

(60) Provisional application No. 61/810,808, filed on Apr. 11, 2013.

(51) Int. Cl.
| | |
|---|---|
| *H03M 13/11* | (2006.01) |
| *H03M 13/35* | (2006.01) |
| *H03M 13/37* | (2006.01) |
| *H03M 13/39* | (2006.01) |

(52) U.S. Cl.
CPC ...... *H03M 13/1111* (2013.01); *H03M 13/1145* (2013.01); *H03M 13/353* (2013.01); *H03M 13/3723* (2013.01); *H03M 13/3746* (2013.01); *H03M 13/3776* (2013.01); *H03M 13/3905* (2013.01); *H03M 13/3972* (2013.01)

(58) Field of Classification Search
CPC ...................................................... H03M 13/11
USPC ........................................ 714/780, 758, 752
See application file for complete search history.

(56) References Cited

U.S. PATENT DOCUMENTS

| | | | |
|---|---|---|---|
| 2006/0045062 A1* | 3/2006 | Gorokhov | H04L 1/0041 370/343 |
| 2012/0076247 A1* | 3/2012 | Tseng | H03M 13/451 375/341 |

* cited by examiner

*Primary Examiner* — Fritz Alphonse
(74) *Attorney, Agent, or Firm* — Joseph Kolodka

(57) ABSTRACT

A computer implemented method for a cyclic (forward-backward) decoding for a forward error-correction FEC scheme includes decoding a given $k-1_{th}$ codeword in a block code of length N in an optical communication system, forwarding M symbols' enhanced log likelihood ratios LLRs produced by decoding the $k-1_{th}$ codeword, decoding the kth codeword together with forwarded M symbols' enhanced LLRS, and feeding backward, to the initial step i) decoding, corresponding overlapped M symbols' enhanced LLRs for decoding of the k−1th codeword again.

11 Claims, 2 Drawing Sheets

CYCLIC DECODING FOR CASCADED FORWARD ERROR-CORRECTION FEC CODES

RELATED APPLICATION INFORMATION

This application claims priority to provisional application No. 61/810,808 filed Apr. 11, 2013, the contents thereof are incorporated herein by reference

BACKGROUND OF THE INVENTION

The present invention relates generally to decoding, and more particularly, to cyclic decoding for cascaded forward error-correction FEC codes.

Future intelligent optical transport networks (OTNs) should possess the capability of dynamic data rate adjustment. One solution is to adjust data rate by changing the overhead of the adopted forward-error-correction (FEC) codes while keeping other system configurations unchanged. Meanwhile, to meet the increasing high demand on data rate, low-density-parity-check (LDPC) codes have been proved to be promising candidates for high-speed OTNs. Therefore rate-adaptive LDPC-coded modulation [1],[2], becomes an essential component for future OTNs.

Prior techniques for cascaded rate-adaptive forward-error correction (FEC) codes efficiently solve the hardware-consuming issue related with conventional rate-adaptive FEC schemes. However, the coding gain of cascaded FEC is usually smaller than that of an optimally designed FEC of comparable overhead. As both the hardware cost and performance are critical in modern high-speed and high-capacity optical communications, it is highly desirable to have rate-adaptive FEC with both low-cost as cascaded FEC and high coding gain as the optimally designed FEC.

The following references discuss prior adaptive FEC techniques in optical communications. See [1] G.-H. Gho, L. Klak, and J. M. Kahn, "Rate-adaptive coding for optical fiber transmission systems," *J. Lightw. Technol.*, vol. 29, no. 2, pp. 222-233, January 2011. [2] M. Arabaci, I. B. Djordjevic, R. Saunders, and R. M. Marcoccia, "Polarization-multiplexed rate-adaptive non-binary-LDPC-coded multilevel modulation with coherent detection for optical transport networks," *Optics Express*, vol. 18, pp. 1820-1832, January 2010.

No existing work in adaptive FEC in optical communications has been able to address the hardware cost issue while maintaining sufficient large coding gain at the mean time. In reference [1], adaptive hard-decision FEC was proposed based on repetition schemes which itself resulted in non-optimal codes and hence incurred degradation in coding gain. In reference [2], a rate-adaptive FEC was proposed based on specifically designed low-density parity-check (LDPC) codes of different overheads. Large coding gain was achieved but the relevant high hardware cost was not considered.

Accordingly, there is a need for a for cyclic decoding that overcomes the limitations of existing techniques.

BRIEF SUMMARY OF THE INVENTION

In a similar aspect of the invention there is provided a system for maintaining, in a software system, a program's calling context correct even when a monitoring of the program goes out of a scope of a program analysis by validating function call transitions and recovering partial paths before and after the violation of the program's control flow. The maintaining aspect includes detecting a violation of control flow invariants in the software system including validating a source and destination of a function call in the software system, interpreting a pre-violation partial path responsive to a failure of the validating, and interpreting a post violation path after a violation of program flow.

These and other advantages of the invention will be apparent to those of ordinary skill in the art by reference to the following detailed description and the accompanying drawings.

DETAILED DESCRIPTION

The present invention is directed to a computer implemented method for a cyclic (forward-backward) decoding for a forward error-correction FEC scheme. In a non-inventive version of a decoding process of cascaded FEC, a subsequent codeword uses the enhanced log-likelihood ratios (LLRs) fed by its proceeding codeword (named as forward decoding). However, as the overlap of re-encoded data exists between two continuous codewords, the decoding of the proceeding codeword can leverage the enhanced LLRs from its subsequent codewords (named as backward decoding). Therefore, the present invention is a new and better decoding process consisting of both forward and backward decoding processes which can improve the decoding performance and achieve larger coding gain.

A cascaded forward error-correction FEC adjusts the data rate by changing the re-encoded data size M. Enlarging M increases the FEC overhead and lowers the code rate. With re-encoding the FEC error-correction capability is improved as enhanced LLRs can be utilized by neighboring codewords to perform decoding. The original decoding of cascaded FEC utilized the overlapped enhanced LLRs in a sequential way, i.e., decoding a subsequent codeword uses enhanced LLRs from its proceeding codeword. In this invention, we explore the decoding in both the forward and backward way, which forms cyclic decoding of cascaded FEC.

Figure 1:
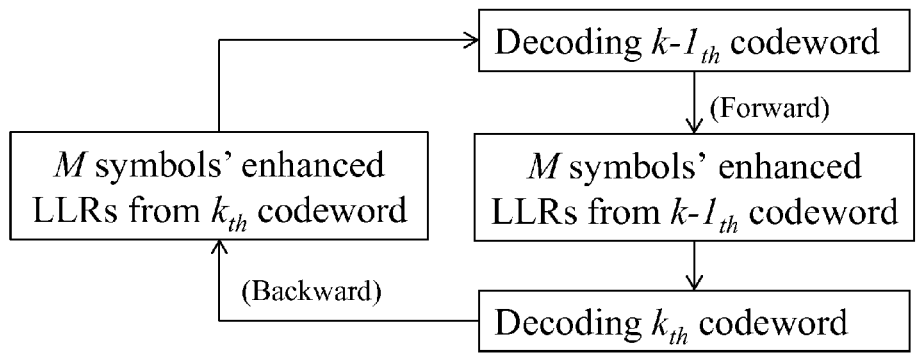
FIG. 1 is a diagram depicting cyclic decoding of cascaded forward error-correction communications, in accordance with the invention.

As shown in FIG. 1, suppose a block code of length N is used and the $k_{th}$ codeword is to be decoded, the M symbols' enhanced LLRs produced by decoding the $k-1_{th}$ codeword is forwarded to the decoding unit of the $k_{th}$ codeword together with samples collected by the receiver. After decoding of the $k_{th}$ codeword is finished, the corresponding overlapped M symbols' enhanced LLRs are fed backward to the decoding unit of the $k-1_{th}$ codeword, in which the $k-1_{th}$ codeword is decoded again. And then the M symbols' enhanced LLRs produced by decoding the $k-1_{th}$ codeword once again are forwarded to the decoding unit of the $k_{th}$ codeword. In such a way, the decoding is performed cyclically between two neighboring codewords. Notice that decoding of each codeword needs LLRs corresponding to N symbols, the second decoding of each codeword will always use the updated LLRs of its N-M symbols from its first decoding (neglected in the figure) together with the M symbols' enhanced LLRs from its subsequent codeword.

Figure 2:
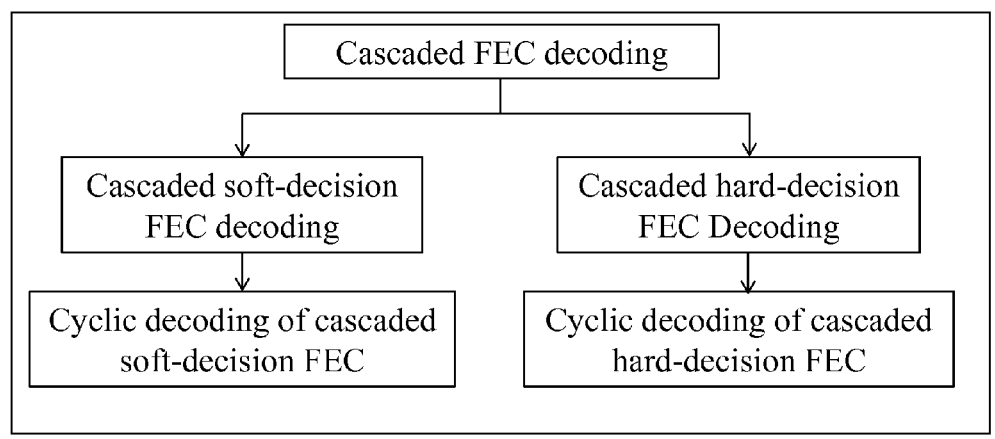
FIG. 2 is a diagram illustrating suitability of the inventive cyclical decoding of FIG. 1 for both cascaded FEC decoding under soft-decision or hard-decision decoding.

Turning now to FIG. 2, there is shown a diagram of the inventive cyclic decoding method. The inventive cascaded decoding process encompasses both cascaded soft decision decoding and cascaded hard decision decoding. In information theory, a soft-decision decoder is a class of decoder used to decode data that has been encoded with an error correcting code. Whereas a hard-decision decoder operates on data that take on a fixed set of possible values (typically 0 or 1 in a binary code), the inputs to a soft-decision decoder may take on a whole range of values in-between. This extra information indicates the reliability of each input data point, and is used to form better estimates of the original data. Therefore, a soft-decision decoder will typically perform better in the presence of corrupted data than its hard-decision counterpart.

The non-inventive aspect of the invention is the right side of the diagram in FIG. 1. The inventive aspect of the decoding method presented herein resides in adding the procedure of feeding the enhanced LLRs backward (left part of diagram in FIG. 1) so that decoding could be performed cyclically each time with newly updated LLRs. Therefore, more errors can be corrected and performance can be improved. The re-encoding feature itself of cascaded FEC enables the possibility of inventing this decoding method. Feeding LLRs backward is the key to enable the cyclic decoding and thus improve the coding performance.

Returning to FIG. 2, the cascaded FEC decoding has both cascaded soft-decision FEC decoding and hard-decision FEC decoding legs that lead to respective cyclic decoding of cascaded soft-decision FEC codes and cyclic decoding of cascaded hard-decision decoding. The cyclic decoding utilizes the sharing of common decoding information (LLRs) between two continuous codewords. The cyclic decoding herein consists of two decoding processes: forward decoding process and backward decoding process. Component FEC codes should be systematic.

The invention may be implemented in hardware, firmware or software, or a combination of the three. Preferably the invention is implemented in a computer program executed on a programmable computer having a processor, a data storage system, volatile and non-volatile memory and/or storage elements, at least one input device and at least one output device. More details are discussed in U.S. Pat. No. 8,380,557, the content of which is incorporated by reference.

Figure 3:
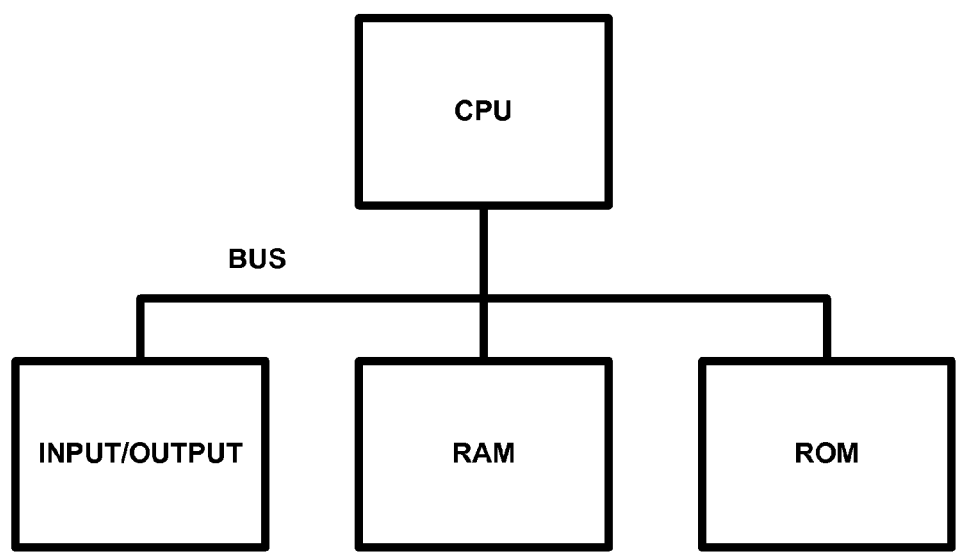
FIG. 3 shows an exemplary computer to perform the inventive cyclic decoding of cascaded FEC codes.

By way of example, a block diagram of a computer to support the system is discussed next in FIG. 3. The computer preferably includes a processor, random access memory (RAM), a program memory (preferably a writable read-only memory (ROM) such as a flash ROM) and an input/output (I/O) controller coupled by a CPU bus. The computer may optionally include a hard drive controller which is coupled to a hard disk and CPU bus. Hard disk may be used for storing application programs, such as the present invention, and data. Alternatively, application programs may be stored in RAM or ROM. I/O controller is coupled by means of an I/O bus to an I/O interface. I/O interface receives and transmits data in analog or digital form over communication links such as a serial link, local area network, wireless link, and parallel link. Optionally, a display, a keyboard and a pointing device (mouse) may also be connected to I/O bus. Alternatively, separate connections (separate buses) may be used for I/O interface, display, keyboard and pointing device. Programmable processing system may be preprogrammed or it may be programmed (and reprogrammed) by downloading a program from another source (e.g., a floppy disk, CD-ROM, or another computer).

Each computer program is tangibly stored in a machine-readable storage media or device (e.g., program memory or magnetic disk) readable by a general or special purpose programmable computer, for configuring and controlling operation of a computer when the storage media or device is read by the computer to perform the procedures described herein. The inventive system may also be considered to be embodied in a computer-readable storage medium, configured with a computer program, where the storage medium so configured causes a computer to operate in a specific and predefined manner to perform the functions described herein.

From the foregoing, it can be appreciated that the present invention provides the competitive value of a decoding process for cascaded FEC where the performance gap between cascaded FEC and optimally designed FEC is reduced.

The foregoing is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the principles of the present invention and that those skilled in the art may implement various modifications without departing from the scope and spirit of the invention. Those skilled in the art could implement various other feature combinations without departing from the scope and spirit of the invention.

The invention claimed is:

1. A computer implemented method for decoding cascaded forward error-correction FEC codes in an optical communication system, the method comprising the steps of:
   i) decoding a given $k-1_{th}$ codeword in a block code of length N in an optical communication system, $k-1_{th}$ representing a sequence of a plurality of the codeword, N representing a length of the codeword;
   ii) forwarding M symbols' enhanced log likelihood ratios LLRs produced by decoding the $k-1_{th}$ codeword, M representing a number of the symbols produced by decoding a $k-1_{th}$ codeword;
   iii) decoding the kth codeword together with forwarded M symbols' enhanced LLRS, kth representing a particular codeword in the sequence of a plurality of the codeword; and
   iv) feeding backward, to the initial step i) decoding, corresponding overlapped M symbols' enhanced LLRs for decoding of the k-1th codeword again.

2. The method of claim 1, wherein the feeding backward step iv) enables decoding to be performed cyclically between two neighboring codes.

3. The method of claim 1, wherein the cyclic decoding steps i)-iv) are carried out responsive to a cascaded soft-decision FEC decoding in parallel with a cascaded hard decision FEC decoding.

4. The method of claim 1, wherein the cyclic decoding steps i)-iv) are carried out responsive to a cascaded hard decision FEC decoding.

5. The method of claim 1, wherein the cyclic decoding steps i)-iv) utilize sharing of common decoding information LLRS between two continuous codewords.

6. The method of claim 1, wherein the decoding steps i)-iv) enable a forward decoding process and a backward decoding process.

7. A system for a computer implemented method for decoding cascaded forward error-correction FEC codes in an optical communication system, the method comprising the steps of:
   a first decoder for decoding a given $k-1_{th}$ codeword in a block code of length N in an optical communication system, $k-1_{th}$ representing a sequence of a plurality of the codeword, N representing a length of the codeword;

a feed forward processor for forwarding M symbols' enhanced log likelihood ratios LLRs produced by decoding the $k-1_{th}$ codeword, M representing a number of the symbols produced by decoding a $k-1_{th}$ codeword;

a second decoder for decoding the kth codeword together with forwarded M symbols' enhanced LLRS, kth representing a particular codeword in the plurality of the codeword; and a feedback path for feeding backward, to the initial step i) decoding, corresponding overlapped M symbols' enhanced LLRs for decoding of the k−1th codeword again.

8. The system of claim 7, wherein the feed forward processor enables decoding to be performed cyclically between two neighboring codes.

9. The system of claim 7, wherein the first decoder, feed forward processor, second decoder and feedback path are operable in response to a cascaded soft-decision FEC decoding in parallel with a cascaded hard decision FEC decoding.

10. The system of claim 7, wherein the first decoder, feed forward processor, second decoder and feedback path are operable in response to a cascaded soft decision FEC decoding.

11. The system of claim 7, wherein the first decoder, feed forward processor, second decoder and feedback path are operable to utilize sharing of common decoding information LLRS between two continuous codewords.

\* \* \* \* \*